United States Patent
Yang

(10) Patent No.: US 10,170,526 B1
(45) Date of Patent: Jan. 1, 2019

(54) ORGANIC LIGHT EMITTING DIODE DISPLAY PANEL AND METHOD FOR MANUFACTURING SAME

(71) Applicant: Wuhan China Star Optoelectronics Semiconductor Display Technology Co., Ltd., Wuhan, Hubei (CN)

(72) Inventor: Jie Yang, Wuhan (CN)

(73) Assignee: WUHAN CHINA STAR OPTOELECTRONICS SEMICONDUCTOR DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/575,631

(22) PCT Filed: Oct. 19, 2017

(86) PCT No.: PCT/CN2017/106816
§ 371 (c)(1),
(2) Date: Nov. 20, 2017

(30) Foreign Application Priority Data

Aug. 16, 2017 (CN) .......................... 2017 1 0699927

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 27/3211* (2013.01); *H01L 51/52* (2013.01); *H01L 51/56* (2013.01)

(58) Field of Classification Search
None
See application file for complete search history.

(56) References Cited

U.S. PATENT DOCUMENTS

2016/0293675 A1* 10/2016 Kim .................... H01L 27/3211

\* cited by examiner

*Primary Examiner* — Cheung Lee
(74) *Attorney, Agent, or Firm* — Roger D. Emerson; Emerson, Thomson & Bennett, LLC

(57) ABSTRACT

An organic light emitting diode (OLED) display panel and a method for manufacturing the OLED display panel are provided. The OLED display panel includes a thin film transistor layer, an anode layer, a pixel definition layer, a cathode layer, and a barrier layer. The barrier layer is disposed on the pixel definition layer between any two adjacent anodes. The barrier layer blocks an electrical charge released by one of the two adjacent anodes from entering into a region in the cathode layer corresponding to the other of the two adjacent anodes.

13 Claims, 3 Drawing Sheets

ORGANIC LIGHT EMITTING DIODE DISPLAY PANEL AND METHOD FOR MANUFACTURING SAME

FIELD OF INVENTION

This disclosure relates to display technology, and more particularly to an organic light emitting diode display panel and a method for manufacturing the organic light emitting diode display panel.

BACKGROUND OF INVENTION

In panel display technology, organic light-emitting diode (OLED) displays have characteristics of thinness, self-luminosity, fast response times, wide viewing angles, wide color gamut, high brightness, low energy consumption, and many other advantages, and have gradually become a third generation display technology after liquid crystal display technology. Compared to liquid crystal displays (LCDs), OLEDs have advantages of lower energy consumption, thinner, and wide viewing angles, which are incomparable for conventional LCDs. At present, detail degree requirements (i.e. resolution) are getting higher and higher. However, production of high-quality, high-resolution OLED displays still has many challenges.

A core component of an OLED display device is an OLED display panel. An OLED display panel film structure is shown as FIG. 1. The OLED display panel includes a thin film transistor layer 101 and an anode layer, a pixel definition layer 102, a first common layer 103, a light emitting layer, a second common layer 104, and a cathode layer 105 formed on a TFT substrate in sequence.

The OLED display panel works by an electric field between an anode and a cathode, holes are transmitted through the first common layer 103 to the light emitting layer, electrons are transmitted to the light emitting layer through the second common layer 104. The holes and the electrons recombine and then emit light within the light emitting layer.

The OLED display panel is usually used for displaying different colors by a combination of R, G, B three primary colors. Thus, one pixel of the OLED display panel typically contains three light emitting units of R, G, and B colors. In actual use, we require the light emitting units of R, G, and B colors of each pixel can be controlled by a drive circuit individually.

As a resolution of the display panel increases, a number of the light emitting units per unit area increases, thereby resulting in a decrease in distance between the light emitting units. Light emitting layers of the light emitting units of R, G, and B colors are made of different materials, and turn-on voltages of the light emitting units of R, G, and B colors are also different. In manufacturing the OLED display panel, it can be seen that since adjacent light emitting units can communicate with each other through the first common layer 103 and the distance between the light emitting units is small, a few amount of the holes can be injected into the second light emitting unit through the first common layer 103 and are recombined with the electrons in a second light emitting unit to emit light when a first light emitting unit is turned on in a condition of low current. Because the first light emitting unit emits weak light at low current and an influence is generated by a light emission of the second light emitting unit, result is that the first light emitting unit emits impurity. This luminescence phenomenon is called light leakage, and current generated by leakage of a few amount of holes is called leakage current.

For example, it is assumed that the turn-on voltages of the light emitting units of R, G, and B colors are R>G>B.

1. When an R picture is lit at a voltage slightly higher than an R turn-on voltage, a few amount of holes will pass through the first common layer 103 to an interface of adjacent the light emitting units of G and B. Since the R turn-on voltage is greater than a G turn-on voltage and a B turn-on voltage, the holes can enter into the light emitting units of G and B and recombine with the electrons to emit light.

2. When a G picture is lit at a voltage slightly higher than a G turn-on voltage, a few amount of holes will pass through the first common layer 103 to an interface of adjacent the light emitting units of R and B. Since the G turn-on voltage is greater than a B turn-on voltage, the holes can enter into the light emitting unit of B and recombine with the electrons to emit light. The G turn-on voltage is lower than the R turn-on voltage, the holes cannot enter into the light emitting unit of R, and thereby R cannot emit light.

3. When a B picture is lit at a voltage slightly higher than the B turn-on voltage, a few amount of holes will pass through the first common layer 103 to an interface of adjacent the light emitting units of R and G. Since the B turn-on voltage is lower than the R turn-on voltage and the G turn-on voltage, the holes cannot enter the light emitting units of R and G, R and G cannot emit light. That is, when R and G are lit at low current individually, it may cause the adjacent light emitting units to emit light, thereby leading to uneven light emission.

In addition, when R is lit at a high current, a few amount of holes can provide for light emitting units of G and B for emitting light. However, brightness is relatively weak and is covered by a strong light emitted by the light emitting unit of R. The light emitted by the light emitting units of G and B cannot be identified by human eyes.

Thus, the leakage is generally more obvious in a situation of low current and the leakage will reduce display effect of the OLED display panel.

SUMMARY OF THE INVENTION

The object of this disclosure is to provide an organic light emitting diode (OLED) display panel for solving drawbacks of the leakage phenomenon due to the sharing of electric charges in adjacent sub-pixels.

In order to solve the above-mentioned drawbacks, the technical solutions provided by the disclosure are as follows.

This disclosure provides an organic light emitting diode (OLED) display panel, which comprises:

a thin film transistor layer;

an anode layer formed on the thin film transistor layer, the anode layer comprising at least two arrays of anodes arranged in an array;

a pixel definition layer formed on the thin film transistor layer, the pixel definition layer comprising a plurality of sub-pixel openings, wherein the sub-pixel openings and the anodes are aligned with each other; and a barrier layer disposed on the pixel definition layer between any two of the anodes adjacent to each other, wherein the barrier layer is configured to block an electrical charge released by one of the two adjacent anodes from entering into a region in a cathode layer corresponding to the other of the two adjacent anodes;

a height of the barrier layer in a direction perpendicular to a plane of the OLED display panel is greater than a height of a sum of a first common layer, a second common layer, and the cathode layer.

According to a preferred embodiment of the disclosure, the OLED display panel further comprises:

the first common layer formed on the pixel definition layer, wherein the pixel definition layer and the anode layer are completely covered by the first common layer;

a light emitting layer formed on the first common layer, wherein the light emitting layer comprises at least two light emitting units corresponding to the sub-pixel openings;

the second common layer formed on the first common layer, wherein the light emitting layer and the first common layer are completely covered by the second common layer; and the cathode layer formed on the second common layer.

According to a preferred embodiment of the disclosure, the barrier layer comprises two first short sides parallel to each other and a first long side remote from the sub-pixel layer; and a length of the first long side is smaller than a width of the pixel definition layer between adjacent pixels.

According to a preferred embodiment of the disclosure, the first common layer comprises a hole injection layer and a hole transport layer, and the second common layer comprises an electron injection layer and an electron transport layer.

This disclosure provides a method for manufacturing an organic light emitting diode (OLED) display panel, which comprises steps of:

a step S40 of forming a pixel definition layer on a first substrate;

a step S50 of forming at least two sub-pixel openings in the pixel definition layer corresponding to anodes;

a step S60 of forming a barrier layer on the pixel definition layer between any two of the anodes adjacent to each other;

a step S70 of forming a first common layer on the pixel definition layer;

a step S80 of forming at least two light emitting units on the first common layer corresponding to the sub-pixel openings; and a step S90 of forming a second common layer and a cathode layer on the first common layer sequentially.

According to a preferred embodiment of the disclosure, before the step S40, the method further comprises steps of:

a step S10 of forming a thin film transistor layer on the first substrate;

a step S20 of forming an anode layer on the thin film transistor layer; and a step S30 of forming the anode layer to include at least two arrays of anodes arranged in an array.

According to a preferred embodiment of the disclosure, the barrier layer is configured to block an electrical charge released by one of the two adjacent anodes from entering into a region in the cathode layer corresponding to the other of the two adjacent anodes; and a height of the barrier layer in a direction perpendicular to a plane of the OLED display panel is greater than a height of a sum of the first common layer, the second common layer, and the cathode layer.

According to a preferred embodiment of the disclosure, the barrier layer comprises two first short sides parallel to each other and a first long side remote from the sub-pixel layer; and a length of the first long side is smaller than a width of the pixel definition layer between adjacent pixels.

According to a preferred embodiment of the disclosure, the first common layer comprises a hole injection layer and a hole transport layer, and the second common layer comprises an electron injection layer and an electron transport layer.

This disclosure provides an organic light emitting diode (OLED) display panel, which comprises:

a thin film transistor layer;

an anode layer formed on the thin film transistor layer, the anode layer comprising at least two arrays of anodes arranged in an array;

a pixel definition layer formed on the thin film transistor layer, the pixel definition layer comprising a plurality of sub-pixel openings, wherein the sub-pixel openings and the anodes are aligned with each other; and a barrier layer disposed on the pixel definition layer between any two of the anodes adjacent to each other, and the barrier layer is configured to block an electrical charge released by one of the two adjacent anodes from entering into a region in a cathode layer corresponding to the other of the two adjacent anodes.

According to a preferred embodiment of the disclosure, the OLED display panel further comprises:

a first common layer formed on the pixel definition layer, wherein the pixel definition layer and the anode layer are completely covered by the first common layer;

a light emitting layer formed on the first common layer, wherein the light emitting layer comprises at least two light emitting units corresponding to the sub-pixel openings;

a second common layer formed on the first common layer, wherein the light emitting layer and the first common layer are completely covered by the second common layer; and the cathode layer formed on the second common layer.

According to a preferred embodiment of the disclosure, the barrier layer comprises two first short sides parallel to each other and a first long side remote from the sub-pixel layer; and a length of the first long side is smaller than a width of the pixel definition layer between adjacent pixels.

According to a preferred embodiment of the disclosure, the first common layer comprises a hole injection layer and a hole transport layer, and the second common layer comprises an electron injection layer and an electron transport layer.

Advantageous effects of the disclosure are as follows. Compared to the conventional technology, this disclosure provides a barrier layer disposed on the pixel definition layer between any two of the anodes adjacent to each other, and the barrier layer is configured to block an electrical charge released by one of the two adjacent anodes from entering into a light emitting unit in a cathode layer corresponding to the other of the two adjacent anodes through the first common layer. Thus, the leakage phenomenon can be prevented and a display effect of the OLED display panel can be improved.

DESCRIPTION OF DRAWINGS

In order to more clearly describe the embodiments of the disclosure or the conventional technical solutions, the description is used to make a simple introduction of the drawings used in the following embodiments. The following description of the drawings are merely some embodiments of the disclosure, those of ordinary skill in the art can also obtain other drawings based on these drawings without creative effort.

DETAILED DESCRIPTION OF PREFERRED EMBODIMENTS

Figure 1:
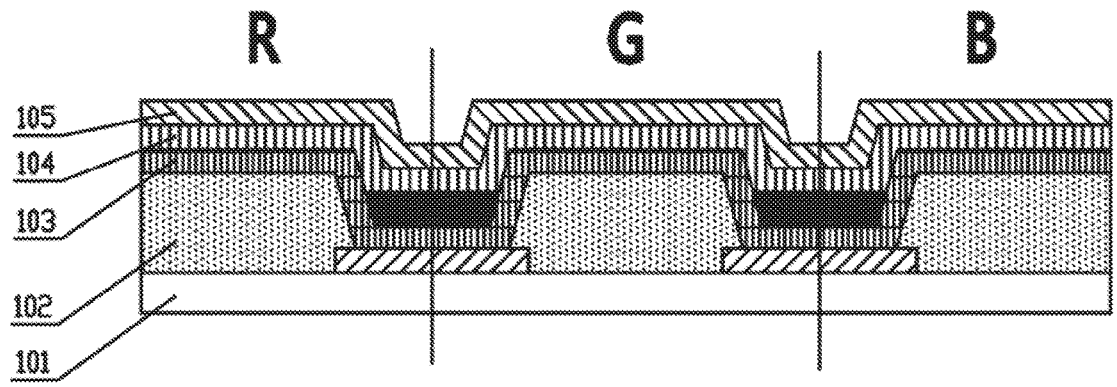
FIG. 1 is a film structure of an OLED display panel in the conventional technology.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

Figure 2:
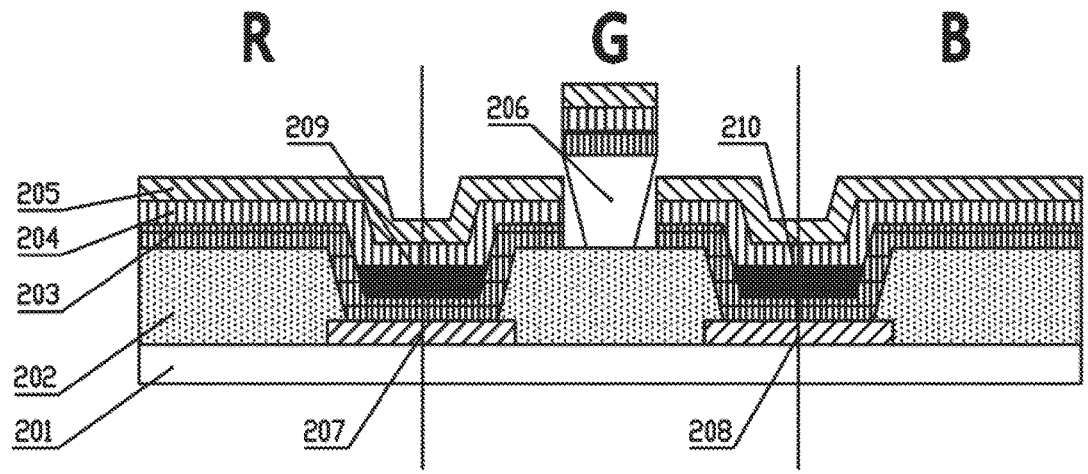
FIG. 2 is a film structure of an organic light emitting diode (OLED) display panel according to a first preferred embodiment of this disclosure.

Referring to FIG. 2, a film structure of an organic light emitting diode (OLED) display panel is shown. The OLED display panel comprises a thin film transistor layer 201, an anode layer, a pixel definition layer 202, a first common layer 203, a light emitting layer, a second common layer 204, a cathode layer 205, and a barrier layer 206.

The anode layer is formed on the thin film transistor layer 201. The anode layer comprises at least two arrays of anodes arranged in an array, as a first anode 207 and a second anode 208 shown in FIG. 2. The anode layer is mainly used to provide holes for absorbing electrons, and the anode layer is transparent, allowing emitted light to pass therethrough.

The pixel definition layer 202 is formed on the thin film transistor layer 201. The pixel definition layer 202 comprises a plurality of sub-pixel openings, and the sub-pixel openings and the anodes are aligned with each other.

Each of sub-pixels is any one of a red sub-pixel, a green sub-pixel and a blue sub-pixel, and sub-pixel colors corresponding to the three adjacent sub-pixels are different in color.

The first common layer 203 is formed on the pixel definition layer 202. The pixel definition layer 202 and the anode layer are completely covered by the first common layer 203. The first common layer 203 is made of one material layer or two or more material layers. In the embodiment, the first common layer 203 includes a hole injection layer and a hole transport layer. The hole injection layer and the hole transport layer are sequentially stacked in a direction away from the anode, and the hole injection layer and the hole transport layer functions similarly, and can be collectively referred to as a hole transport function layer.

The light emitting layer is formed on the first common layer 203, and the light emitting layer includes at least two light emitting units corresponding to the sub-pixel openings, such as a first light emitting unit 209 and a second light emitting unit 210 shown in FIG. 2.

The light emitting layer is an organic semiconductor, having a special energy band structure, which can emit photons having a certain wavelength after absorbing electrons migrating from the anode, and these photons enter our eyes as colors we see.

The second common layer 204 is formed on the first common layer 203. The light emitting layer and the first common layer 203 are completely covered by the second common layer 204.

The second common layer 204 is formed of a one material layer or two or more material layers. In the present embodiment, the second common layer 204 includes an electron injection layer and an electron transport layer, the electron injection layer and the electron transport layer are sequentially stacked in a direction away from the anode layer. The electron injection layer and the electron transport layer have similar functions and can be collectively referred to as an electron transport function layer.

The cathode layer 205 is formed on the second common layer 204, which is typically an alloy having a low work function, and generates electrons at a given voltage.

The barrier layer 206 is disposed on the pixel definition layer 202 between any two of the anodes adjacent to each other. The barrier layer 206 is configured to block an electrical charge released by one of the two adjacent anodes from entering into a region in the cathode layer 205 corresponding to the other of the two adjacent anodes.

A cross-section of the barrier layer 206 is an inverted trapezoid, and a height of the barrier layer 206 in a direction perpendicular to a plane of the OLED display panel is greater than a height of a sum of a first common layer 203, a second common layer 204, and the cathode layer 205. In addition, the barrier layer 206 comprises two first short sides parallel to each other and a first long side remote from the sub-pixel layer, and a length of the first long side is smaller than a width of the pixel definition layer 202 between adjacent pixels.

Figure 3:
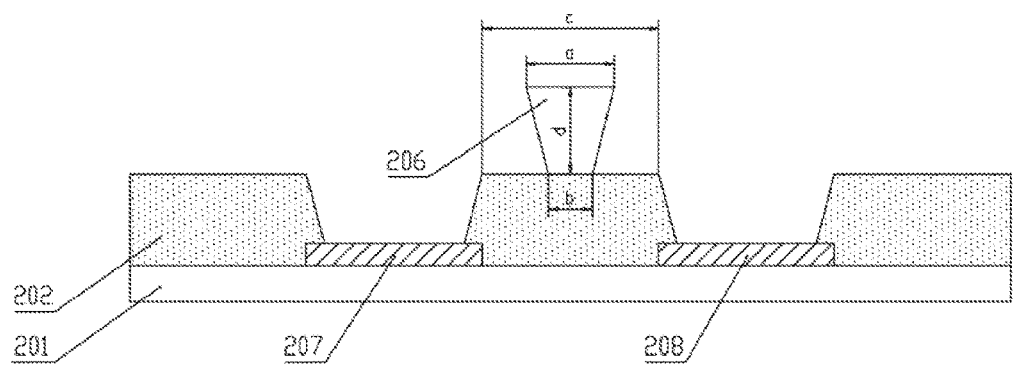
FIG. 3 is a cross-sectional view of a barrier layer in the film structure of the OLED display panel according to the first preferred embodiment of this disclosure.

In this embodiment, as shown in FIG. 3, a length of two first short sides parallel to each other is b, a length of the first long side remote from the sub-pixel layer is a and a width of the pixel definition layer 202 is c. It can be seen from the figures that the length relationship of each side is: c>a>b. In addition, a height of the barrier layer 206 is d. In order to provide a better block effect, the height d of the barrier layer 206 is greater than a thickness of a sum of a first common layer 203, a second common layer 204, and a cathode layer. Preferably, the height d of the barrier layer 206 is 1um.

A material of the barrier layer 206 is an organic material or an inorganic material, preferably silicon nitride or silicon oxide, and a material of the barrier layer 206 is the same as a material of the pixel definition layer 202.

The electrons and the holes are respectively injected from the cathode and the anode into the electron transport layer and the hole transport layer under a situation of being driven by a certain voltage. The electrons and the holes migrate to the light emitting layer through the electron transport layer and hole transport layer, respectively, and meet in the light emitting layer. When the electrons enter into the holes, it releases excess energy in the form of light.

In this embodiment, for example, it is assumed that turn-on voltages of the light emitting units of R, G, and B colors are R>G>B.

When an R picture is lit at a voltage slightly higher than an R turn-on voltage, a few amount of holes will migrate to adjacent light emitting units of G and B through the first common layer 203. A few amount of the holes cannot migrate toward the adjacent light emitting units of G and B due to presence of the barrier layer 206, thereby avoiding leakage.

Similarly, when a G picture is lit at a voltage slightly higher than a G turn-on voltage, or a B picture is lit at a voltage slightly higher than a B turn-on voltage, leakage no longer happens.

The barrier layer 206 is configured to block an electrical charge released by one of the two adjacent anodes from entering into a region in the cathode layer 205 corresponding to the other of the two adjacent anodes, thereby preventing leakage and improving display effect of the OLED display panel.

Figure 4:
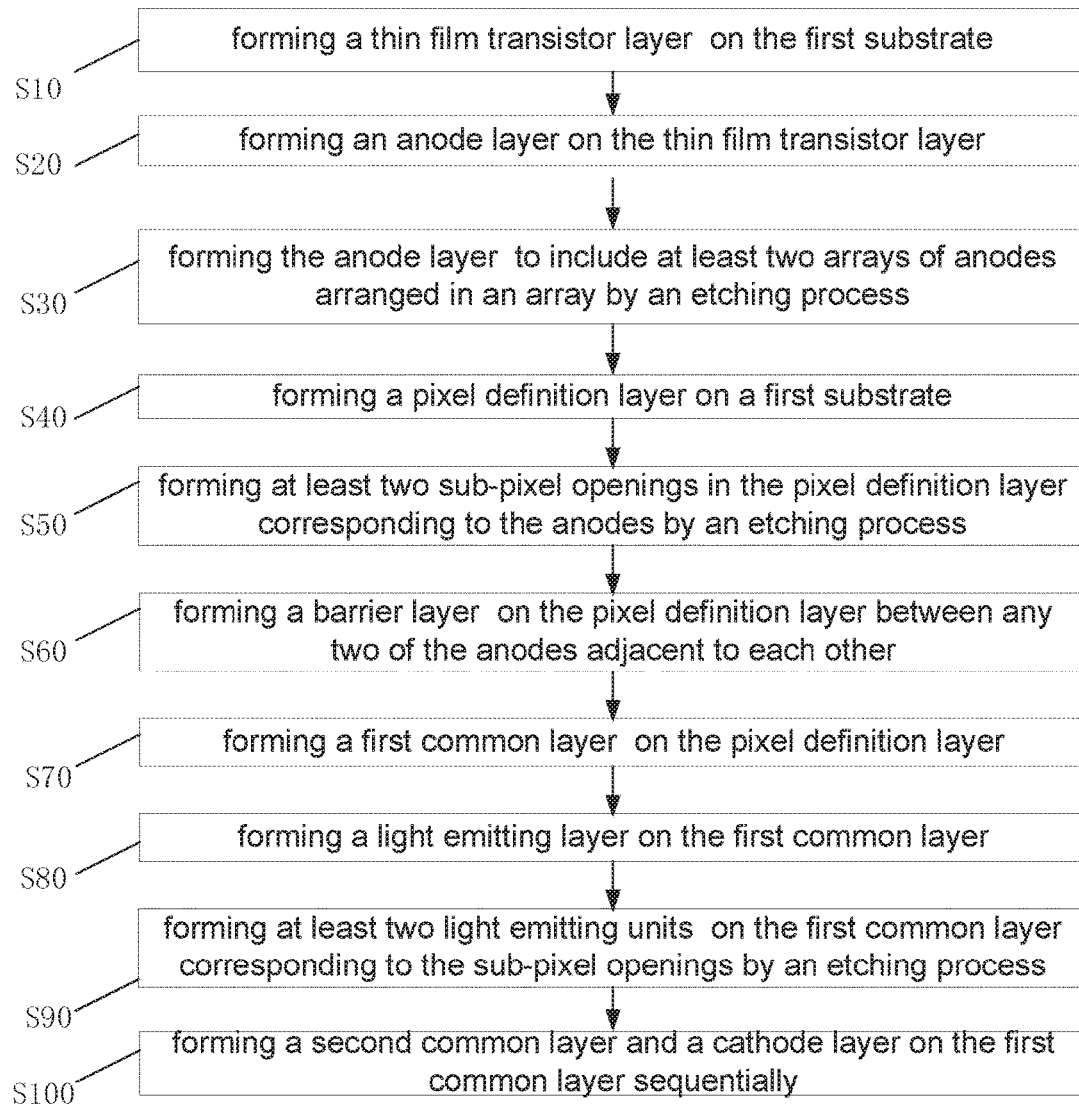
FIG. 4 is a flowchart of a method for manufacturing an organic light emitting diode (OLED) display panel.
Figure 5:
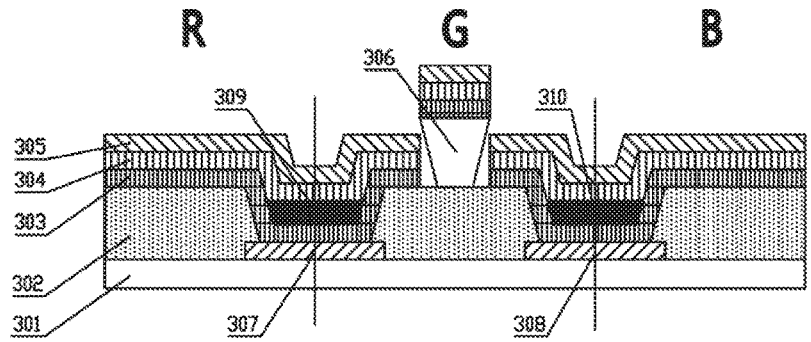
FIG. 5 is a process schematic view of the method for manufacturing the OLED display panel according to a second preferred embodiment of this disclosure.

Referring to FIG. 4 and FIG. 5, a flowchart of a method for manufacturing an organic light emitting diode (OLED) display panel and a process schematic view of the method for manufacturing the OLED display panel are shown. The method comprises steps as follows.

In a step S10, a thin film transistor layer is formed on the first substrate.

First, a substrate is provided. A gate and a gate line of a thin film transistor are formed on a surface of the substrate by using a first mask process. A gate insulating layer, an active layer, a source electrode, a drain electrode, and a passivation layer of the thin film transistor are sequentially formed on the surface of the substrate by using a second mask process.

In a step S20, an anode layer is formed on the thin film transistor layer.

The anode layer is deposited on the thin film transistor layer 301. Specifically, the anode layer is a transparent metal electrode. Preferably, the anode layer is indium tin oxide. The anode layer is mainly used to provide the holes for absorbing the electrons. The anode layer is transparent and allows light to pass through.

In a step S30, the anode layer is formed to include at least two arrays of anodes arranged in an array.

A photoresist is coated on the surface of the anode layer, and the photoresist is exposed and developed. The photoresist is patterned. The anode layer is divided into at least two anode arranged in an array by an etching process. Specifically, the first anode 307 and the second anode 308 are shown in FIG. 2.

In a step S40, a pixel definition layer is formed on a first substrate.

In a step S50, at least two sub-pixel openings are formed in the pixel definition layer corresponding to the anodes.

The pixel definition layer 302 is deposited on the thin film transistor layer 301. The sub-pixel opening is formed on the pixel definition layer 302 corresponding to each of the anodes by using an etching process. Each of sub-pixels is any one of a red sub-pixel, a green sub-pixel and a blue sub-pixel, and sub-pixel colors corresponding to the three adjacent sub-pixels are different in color.

In a step S60, a barrier layer is formed on the pixel definition layer between any two of the anodes adjacent to each other.

The barrier layer 306 is disposed on the pixel definition layer 302 between any two of the anodes adjacent to each other. The barrier layer 306 is configured to block an electrical charge released by one of the two adjacent anodes from entering into a region in the cathode layer 305 corresponding to the other of the two adjacent anodes.

A cross-section of the barrier layer 306 is an inverted trapezoid, and a height of the barrier layer 306 in a direction perpendicular to a plane of the OLED display panel is greater than a height of a sum of a first common layer 303, a second common layer 304, and the cathode layer 305. In addition, the barrier layer 306 comprises two first short sides parallel to each other and a first long side remote from the sub-pixel layer, and a length of the first long side is smaller than a width of the pixel definition layer 302 between adjacent pixels.

Figure 6:
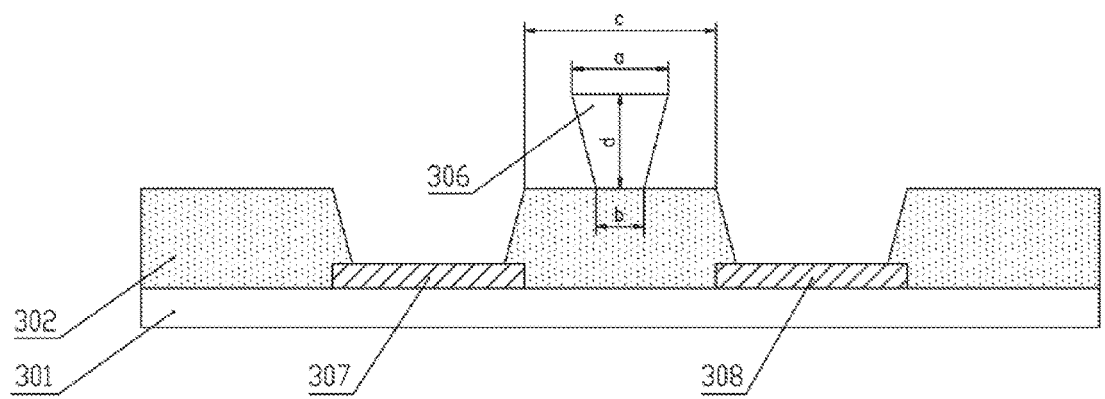
FIG. 6 is a cross-sectional view of a barrier layer in the film structure of the OLED display panel according to the second preferred embodiment of this disclosure.

Specifically, in this embodiment, as shown in FIG. 6, a length of two first short sides parallel to each other is b, a length of the first long side remote from the sub-pixel layer is a and a width of the pixel definition layer 302 is c. It can be seen from the figures that the length relationship of each side is: c>a>b. In addition, a height of the barrier layer 306 is d. In order to provide a better blocking, the height d of the barrier layer 306 is greater than a thickness of a sum of a first common layer 303, a second common layer 304, and a cathode. Preferably, the height d of the barrier layer 206 is 1 μm.

A material of the barrier layer 306 is an organic material or an inorganic material, preferably silicon nitride or silicon oxide, and a material of the barrier layer 306 is the same as a material of the pixel definition layer 302.

In a step S70, a first common layer is formed on the pixel definition layer.

The first common layer 303 is formed on the pixel definition layer 302. The pixel definition layer 302 and the anode layer are completely covered by the first common layer 303.

The first common layer 303 is made of one material layer or two or more material layers. In the embodiment, the first common layer 303 includes a hole injection layer and a hole transport layer. The hole injection layer and the hole transport layer are sequentially stacked in a direction away from the anode, and the hole injection layer and the hole transport layer functions similarly, and can be collectively referred to as a hole transport function layer.

In a step S80, at least two light emitting units are formed on the first common layer corresponding to the sub-pixel openings.

The light emitting layer is formed on the first common layer 303, and the light emitting layer includes at least two light emitting units corresponding to the sub-pixel openings, such as a first light emitting unit 309 and a second light emitting unit 310 shown in FIG. 2.

The light emitting layer is an organic semiconductor, having a special energy band structure, which can emit photons with a certain wavelength after absorbing electrons migrating from the anode, and these photons enter our eyes as colors we see.

In a step S90, a second common layer and a cathode layer are formed on the first common layer sequentially.

The second common layer 304 is deposited on the first common layer 303. The light emitting layer and the first common layer 303 are completely covered by the second common layer 304.

The second common layer 304 is formed of a one material layer or two or more material layers. In the present embodiment, the second common layer 304 includes an electron injection layer and an electron transport layer, the electron injection layer and the electron transport layer are sequentially stacked in a direction away from the anode layer. The electron injection layer and the electron transport layer have similar functions and can be collectively referred to as an electron transport function layer.

The cathode layer 305 is deposited on the second common layer 304. The cathode layer is typically an alloy having a low work function, and generates electrons at a given voltage.

The electrons and the holes are respectively injected from the cathode and the anode into the electron transport layer and the hole transport layer under a situation of being driven by a certain voltage. The electrons and the holes migrate to the light emitting layer through the electron transport layer and hole transport layer, respectively, and meet in the light emitting layer. When the electrons enter into the holes, it releases excess energy in the form of light.

In this embodiment, for example, it is assumed that turn-on voltages of the light emitting units of R, G, and B colors are R>G>B.

When an R picture is lit at a voltage slightly higher than an R turn-on voltage, a few amount of holes will migrate to adjacent light emitting units of G and B through the first common layer 203. A few amount of the holes cannot migrate toward the adjacent light emitting units of G and B due to presence of the barrier layer 306, thereby avoiding the leakage phenomenon.

Similarly, when a G picture is lit at a voltage slightly higher than a G turn-on voltage, or a B picture is lit at a voltage slightly higher than a B turn-on voltage, there will be no leakage.

This disclosure provides an organic light emitting diode (OLED) display panel and a method for manufacturing the organic light emitting diode display panel. The OLED display panel comprises a thin film transistor layer, an anode layer, a pixel definition layer, a cathode layer, and a barrier layer. The barrier layer is disposed on the pixel definition layer between any two of the anodes adjacent to each other, and the barrier layer is configured to block an electrical charge released by one of the two adjacent anodes from entering into a light emitting unit in a cathode layer corresponding to the other of the two adjacent anodes through the first common layer. Thus, leakage can be prevented and the display of the OLED display panel can be improved.

This disclosure has been described with preferred embodiments thereof, and it is understood that many changes and modifications to the described embodiment can be carried out without departing from the scope and the spirit of the disclosure that is intended to be limited only by the appended claims.

What is claimed is:

1. An organic light emitting diode (OLED) display panel, comprising:
   a thin film transistor layer;
   an anode layer formed on the thin film transistor layer, the anode layer comprising at least two arrays of anodes arranged in an array;
   a pixel definition layer formed on the thin film transistor layer, the pixel definition layer comprising a plurality of sub-pixel openings, wherein the sub-pixel openings and the anodes are aligned with each other; and
   a barrier layer disposed on the pixel definition layer between any two of the anodes adjacent to each other, wherein the barrier layer is configured to block an electrical charge released by one of the two adjacent anodes from entering into a region in a cathode layer corresponding to the other of the two adjacent anodes;
   wherein a height of the barrier layer in a direction perpendicular to a plane of the OLED display panel is greater than a height of a sum of a first common layer, a second common layer, and the cathode layer.

2. The OLED display panel according to claim 1, wherein the OLED display panel further comprises:
   the first common layer formed on the pixel definition layer, wherein the pixel definition layer and the anode layer are completely covered by the first common layer;
   a light emitting layer formed on the first common layer, wherein the light emitting layer comprises at least two light emitting units corresponding to the sub-pixel openings;
   the second common layer formed on the first common layer, wherein the light emitting layer and the first common layer are completely covered by the second common layer; and
   the cathode layer formed on the second common layer.

3. The OLED display panel according to claim 2, wherein the first common layer comprises a hole injection layer and a hole transport layer, and the second common layer comprises an electron injection layer and an electron transport layer.

4. The OLED display panel according to claim 1, wherein the barrier layer comprises two first short sides parallel to each other and a first long side remote from a sub-pixel layer; and
   a length of the first long side is smaller than a width of the pixel definition layer between adjacent pixels.

5. A method for manufacturing an organic light emitting diode (OLED) display panel, comprising steps of:
   a step S40 of forming a pixel definition layer on a first substrate;
   a step S50 of forming at least two sub-pixel openings in the pixel definition layer corresponding to anodes;
   a step S60 of forming a barrier layer on the pixel definition layer between any two of the anodes adjacent to each other;
   a step S70 of forming a first common layer on the pixel definition layer;
   a step S80 of forming at least two light emitting units on the first common layer corresponding to the sub-pixel openings; and
   a step S90 of forming a second common layer and a cathode layer on the first common layer sequentially.

6. The method according to claim 5, wherein before the step S40, the method further comprises steps of:
   a step S10 of forming a thin film transistor layer on the first substrate;
   a step S20 of forming an anode layer on the thin film transistor layer; and
   a step S30 of forming the anode layer to include at least two arrays of anodes arranged in an array.

7. The method according to claim 5, wherein the barrier layer is configured to block an electrical charge released by one of the two adjacent anodes from entering into a region in the cathode layer corresponding to the other of the two adjacent anodes; and
   a height of the barrier layer in a direction perpendicular to a plane of the OLED display panel is greater than a height of a sum of the first common layer, the second common layer, and the cathode layer.

8. The method according to claim 5, wherein the barrier layer comprises two first short sides parallel to each other and a first long side remote from a sub-pixel layer; and
   a length of the first long side is smaller than a width of the pixel definition layer between adjacent pixels.

9. The method according to claim 5, wherein the first common layer comprises a hole injection layer and a hole transport layer, and the second common layer comprises an electron injection layer and an electron transport layer.

10. An organic light emitting diode (OLED) display panel, comprising:
a thin film transistor layer;
an anode layer formed on the thin film transistor layer, the anode layer comprising at least two arrays of anodes arranged in an array;
a pixel definition layer formed on the thin film transistor layer, the pixel definition layer comprising a plurality of sub-pixel openings, wherein the sub-pixel openings and the anodes are aligned with each other; and
a barrier layer disposed on the pixel definition layer between any two of the anodes adjacent to each other, and the barrier layer is configured to block an electrical charge released by one of the two adjacent anodes from entering into a region in a cathode layer corresponding to the other of the two adjacent anodes.

11. The OLED display panel according to claim 10, wherein the OLED display panel further comprises:
a first common layer formed on the pixel definition layer, wherein the pixel definition layer and the anode layer are completely covered by the first common layer;
a light emitting layer formed on the first common layer, wherein the light emitting layer comprises at least two light emitting units corresponding to the sub-pixel openings;
a second common layer formed on the first common layer, wherein the light emitting layer and the first common layer are completely covered by the second common layer; and
the cathode layer formed on the second common layer.

12. The OLED display panel according to claim 11, wherein the first common layer comprises a hole injection layer and a hole transport layer, and the second common layer comprises an electron injection layer and an electron transport layer.

13. The OLED display panel according to claim 10, wherein the barrier layer comprises two first short sides parallel to each other and a first long side remote from a sub-pixel layer; and
a length of the first long side is smaller than a width of the pixel definition layer between adjacent pixels.

* * * * *